United States Patent
Hsu

(10) Patent No.: US 7,064,627 B2
(45) Date of Patent: Jun. 20, 2006

(54) SIGNAL TRANSMISSION STRUCTURE HAVING A NON-REFERENCE REGION FOR MATCHING TO A CONDUCTIVE BALL ATTACHED TO THE SIGNAL TRANSMISSION STRUCTURE

(75) Inventor: Jimmy Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/700,684

(22) Filed: Nov. 3, 2003

(65) Prior Publication Data

US 2005/0017827 A1    Jan. 27, 2005

(30) Foreign Application Priority Data

Jul. 24, 2003    (TW) ............................... 92120189 A

(51) Int. Cl.
*H01P 5/02*    (2006.01)

(52) U.S. Cl. .......................................... 333/34; 333/238
(58) Field of Classification Search ................ 333/34, 333/238, 246
See application file for complete search history.

(56) References Cited

U.S. PATENT DOCUMENTS

| 5,021,866 A | * | 6/1991 | Sudo et al. ................... 257/736 |
| 5,184,095 A | * | 2/1993 | Hanz et al. ...................... 333/33 |
| 6,624,729 B1 | * | 9/2003 | Wright et al. ................ 333/238 |

FOREIGN PATENT DOCUMENTS

| JP | 05-029772 | 2/1993 |
| JP | 07-147352 | 6/1995 |

* cited by examiner

*Primary Examiner*—Benny Lee
(74) *Attorney, Agent, or Firm*—J.C. Patents

(57) ABSTRACT

A signal transmission structure is provided. The structure comprises a reference plane, a bonding pad, a conductive trace and a conductive ball. By changing the shapes of the reference plane and the conductive trace, the equivalent capacitance at the conductive ball and the signal route near the conductive ball is reduced, or the equivalent inductance at the conductive ball and the signal route near the conductive ball is increased to compensate the high equivalent capacitance between the conductive ball and the reference plane. Therefore, the impedance of the conductive ball and the signal route near the conductive ball are matched to increase the integrity of the signals after these signals pass through the conductive ball and the signal neighbor route near the conductive ball.

13 Claims, 7 Drawing Sheets

SIGNAL TRANSMISSION STRUCTURE HAVING A NON-REFERENCE REGION FOR MATCHING TO A CONDUCTIVE BALL ATTACHED TO THE SIGNAL TRANSMISSION STRUCTURE

CROSS-REFERENCE TO RELATED APPLICATION

This application claims the priority benefit of Taiwan application serial no. 92120189, filed Jul. 24, 2003.

BACKGROUND OF THE INVENTION

1. Field of the Invention

The present invention relates to a signal transmission structure, more particularly to a signal transmission structure adapted to a signal transmission media for improving impedance mismatch of a signal transmission route.

2. Description of the Related Art

Because electronic technologies have been advanced, a variety of electronic products with different functions are gradually involved into our work and life. Electronic products usually have a motherboard that includes a circuit board and many electronic components. The electronic components are assembled on the circuit board, and are electrically connected thereto by internal routes in the circuit board for serving the functions for which the electronic products are designed, wherein these electronic components further comprises integrated circuit (IC) components. In order to efficiently protect IC components due to their fragile structure and electrically connect the IC components to external means, package technologies are used to achieve the functions mentioned above.

For IC components with a high pin count, ball grid array (BGA) technology has been widely used in the chip package field because it can provide a high pin count, better heat dissipation and good electrical performance. In realistic application, IC dies are electrically connected to an IC carrier through many conductive traces or bumps by wire bonding (WB) technology or flip chip (FC) bonding technology. Then the IC carrier is electrically and structurally connected to a large printed circuit board through a plurality of conductive balls by BGA technology. Therefore, two interfaces, two components or two terminals are separately formed on the IC carrier and the printed circuit board can transmit signals to each other through these conductive balls.

Referring to FIGS. 1A and 1B, FIG. 1A illustrates a top view of a signal transmission structure of the prior art, and FIG. 1B illustrates a cross sectional view of the signal transmission structure of FIG. 1A, which is applied to a signal transmission media. A signal transmission structure 100 (FIG. 1A) is adapted to be used in a signal transmission media 10 (FIG. 1B), such as a printed circuit board. The signal transmission structure 100 includes a reference plane 110, a bonding pad 120, a conductive trace 130 and a conductive ball 140. The reference plane 110 can be, for example, a ground plane or a power plane, which is embedded within the signal transmission media 10. The bonding pad 120 and the conductive trace 130 are formed by a circuit pattern 10a (FIG. 1B) on the surface of the signal transmission media 10. Moreover, the bonding pad 120 and the conductive trace 130 are electrically isolated from the reference plane 110 by a dielectric layer 10b (FIG. 1B); therefore, the bonding pad 120 and the conductive trace 130 are non-coplanar with the reference plane 110. The conductive ball 140 is located on a side of the bonding pad 120, which is away from the reference plane 110. In addition, the top of the conductive ball 140 is connected to a bonding pad 12a of another signal transmission media 12, such as an IC carrier, and then signals can be transmitted through a conductive trace 12b as shown in FIG. 1B.

Referring to FIGS. 1A and 1B, when signals go through the conductive trace 130, the bonding pad 120, the conductive ball 140, the bonding pad 12a and the conductive trace 12b, due to the geometric shape of the conductive ball 140, a non-continuous low impedance characteristic exits between the conductive ball 140 and the reference plane 110, and results in impedance mismatch at the signal route near to the conductive ball 140. Therefore, when signals go through the signal route near to the conductive ball 140, reflection of signals exists thereat, and leads to the problem that signals cannot be completely delivered from a signal terminal through the conductive ball 140 to another signal terminal. In addition, by the increase of the operational frequency of signals, a return loss of signals will reduce and an insertion loss of signals will increase while signals go through the conductive ball 140. Accordingly, impedance mismatch at the signal route near to the conductive ball 140 will be worse. That has impact for transmission of high frequency signals.

SUMMARY OF THE INVENTION

Accordingly, the object of the present invention is to provide a signal transmission structure, which is adapted to be used in a signal transmission media, such as an IC carrier or a printed circuit board, to reduce impedance mismatch within signal transmission route, and to increase electrical performance of the signal transmission media.

In order to achieve the above object of the present invention, the present invention discloses a signal transmission structure, comprising a reference plane; a bonding pad, which is non-coplanar with the reference plane; a conductive trace non-coplanar with the reference plane, one end of the conductive trace connected to the bonding pad, the conductive trace having a neighbor region with a width smaller than that of remainder of the conductive trace; and a conductive ball located on a side of the bonding pad, which is away from the reference plane. In addition, the reference plane can be a power plane or a ground plane.

In order to achieve the object of the present invention mentioned above, the present invention further discloses a signal transmission structure, comprising a reference plane having a non-reference region; a bonding pad which is non-coplanar with the reference plane; a conductive trace coplanar with the bonding pad, one end of the conductive trace connected to the bonding pad, wherein the conductive trace is across the non-reference region just away from the bonding pad; and a conductive ball located on a side of the bonding pad, which is away from the reference plane. In addition, the reference plane can be a power plane or a ground plane.

In order to achieve the object of the present invention mentioned above, the present invention further discloses a signal transmission structure, comprising a reference plane having a first non-reference region; a bonding pad which is non-coplanar with the reference plane, wherein the first non-reference region is under the bonding pad; a conductive trace coplanar with the reference plane, one end of the conductive trace connected to the bonding pad; and a conductive ball located on a side of the bonding pad, which is away from the reference plane. Besides, the reference plane further comprises a second non-reference region just away from the bonding pad. In addition, the reference plane can be a power plane or a ground plane.

From the descriptions mentioned above, the signal transmission structure in accordance with the present invention reduces an equivalent capacitance at the conductive ball and the signal route near the conductive ball or increases an equivalent inductance at the conductive ball and the signal route near the conductive ball by changing the shapes of the reference plane or the conductive trace for compensating a high equivalent capacitance between the conductive ball and the reference plane. Therefore, the conductive ball and the signal route near the conductive ball have better impedance match and integrity of signals can be maintained after these signals pass through the conductive ball and the signal route near the conductive ball.

DESCRIPTION OF THE PREFERRED EMBODIMENT

Figure 1A:
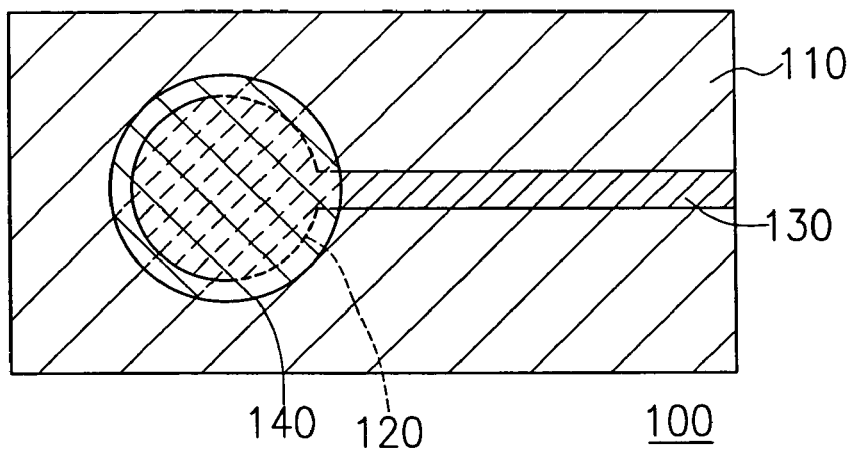
FIG. 1A illustrates a top view of a signal transmission structure of the prior art.
Figure 1B:
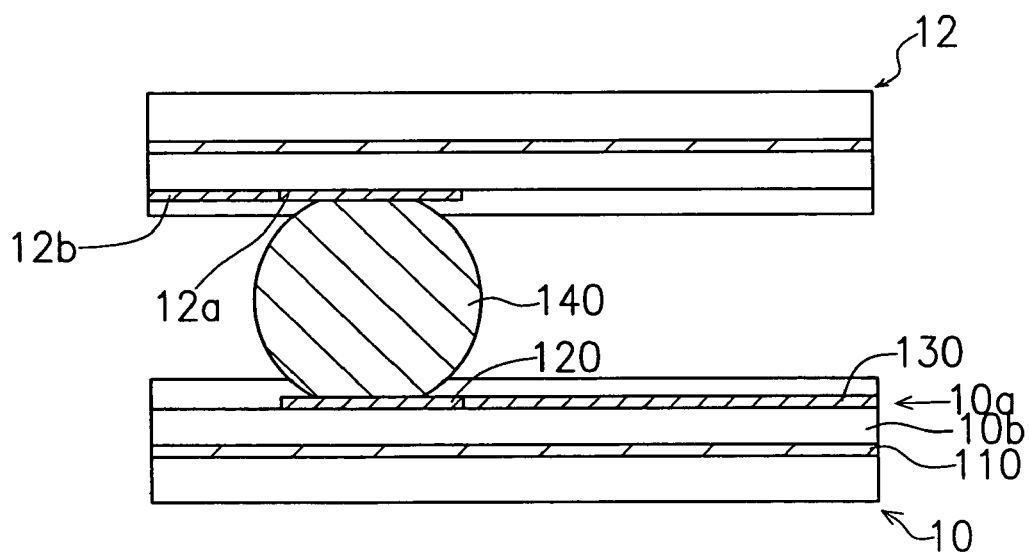
FIG. 1B illustrates a cross sectional view of the signal transmission structure of FIG. 1A, which is applied to a signal transmission media.

In order to make the object, characteristic and advantages of the present invention mentioned above more understandable, some preferred embodiments of the present invention complying with figures are described in detail as below. Wherever possible, the same reference numbers are used in the drawings and the description to refer to the same parts.

Figure 2A:
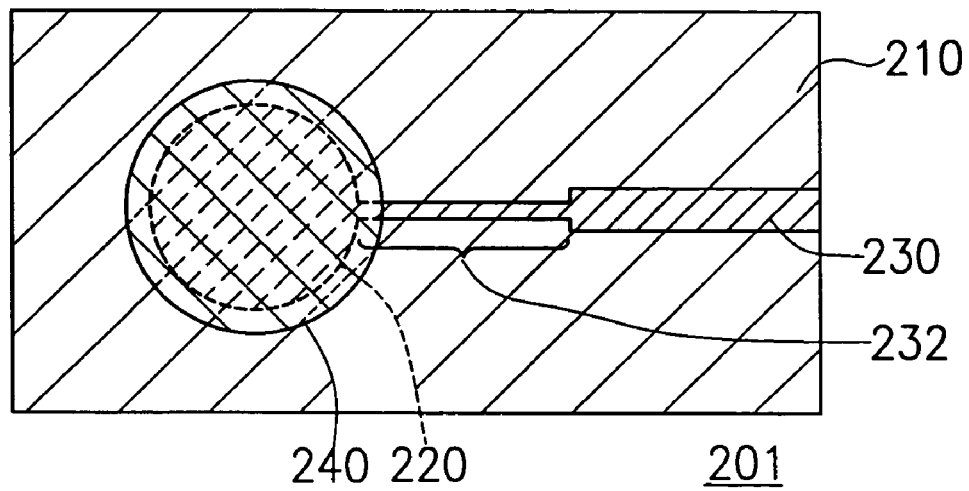
FIG. 2A illustrates a top view of a signal transmission structure in accordance with the first embodiment of the present invention.
Figure 2B:
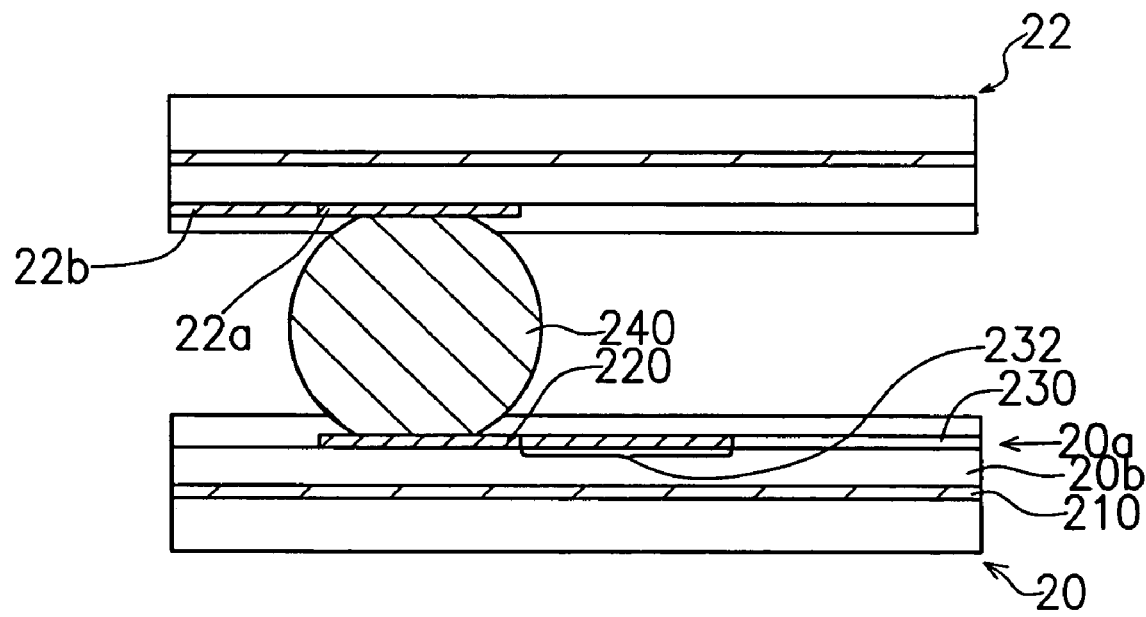
FIG. 2B illustrates a cross sectional view of the signal transmission structure of FIG. 2A, which is applied to a signal transmission media.

Referring to FIGS. 2A and 2B, FIG. 2A illustrates a top view of a signal transmission structure in accordance with the first embodiment of the present invention, and FIG. 2B illustrates a cross sectional view of the signal transmission structure of FIG. 2A, which is applied to a signal transmission media. A signal transmission structure 201 (FIG. 2A) is adapted to be used in a signal transmission media 20 (FIG. 2B), such as a printed circuit board. The signal transmission structure 201 includes a reference plane 210, a bonding pad 220, a conductive trace 230 and a conductive ball 240. The reference plane 210 can be, for example, a ground plane or a power plane, which is embedded within the signal transmission media 20. The bonding pad 220 and the conductive trace 230 are formed by the circuit pattern 20a (FIG. 2B) on the surface of the signal transmission media 20. Moreover, the bonding pad 220 and the conductive trace 230 are electrically isolated from the reference plane 210 by a dielectric layer 20b (FIG. 2B); therefore, the bonding pad 220 and the conductive trace 230 are non-coplanar with the reference plane 210. The conductive ball 240 is located on a side of the bonding pad 220, which is away from the reference plane 210. In addition, the top of the conductive ball 240 is connected to a bonding pad 22a of another signal transmission media 22, such as an IC carrier, and then signals are transmitted through a conductive trace 22b as shown in FIG. 2B.

Referring to FIGS. 2A and 2B, due to the geometric shape of the conductive ball 240, a non-continuous low impedance characteristic exits between the conductive ball 240 and the reference plane 210, and results in impedance mismatch at the signal route near to the conductive ball 240. Therefore, when signals go through the signal route near to the conductive ball 240, reflection of signals exists thereat, and leads to the problem that signals cannot be completely transmitted from a signal terminal through the conductive ball 240 to another signal terminal. Under this circumstance, the present invention increases the equivalent inductance at the neighbor region 232 of the signal route; therefore, the conductive ball 240 and the signal route near the conductive ball have better impedance match from the equivalent equation of impedance:

$$Z=\sqrt{L/C}$$

wherein Z represents impedance, L represents inductance, and C represents capacitance.

Referring to FIGS. 2A and 2B, in the first embodiment of the present invention, the conductive trace 230 has a neighbor region 232, and the width of the neighbor region 232 of the conductive trace 230 is smaller than that of remainder of the conductive trace 230. In comparison with the reminder of the conductive trace 230, the neighbor region 232 of the conductive trace 230 has a narrower width, i.e., a smaller area. Therefore, the equivalent inductance between the neighbor region 232 of the conductive trace 230 and the reference plane 210 can be increased, and the integrity of signals can be maintained after these signals pass through the conductive ball 240 and the signal route near the conductive ball.

As mentioned above, the first embodiment increases the equivalent inductance between the neighbor region of the conductive trace and the reference plane by shrinking the width or area of the neighbor region of the conductive trace to compensate the high equivalent capacitance between the conductive ball and the reference plane. Therefore, the conductive ball and the signal route near the conductive ball have better impedance match and integrity of signals can be maintained after these signals pass through the conductive ball and the signal route near the conductive ball.

In comparison with the first embodiment mentioned above, the second embodiment increases the equivalent inductance between the neighbor region of the conductive trace and the reference plane by forming a non-reference region, such as an opening, within the reference plane, wherein the conductive trace is across the non-reference region just away from the bonding pad, and compensates the high equivalent capacitance between the conductive ball and the reference plane. Therefore, the conductive ball and the signal route near the conductive ball have better impedance match.

Figure 3A:
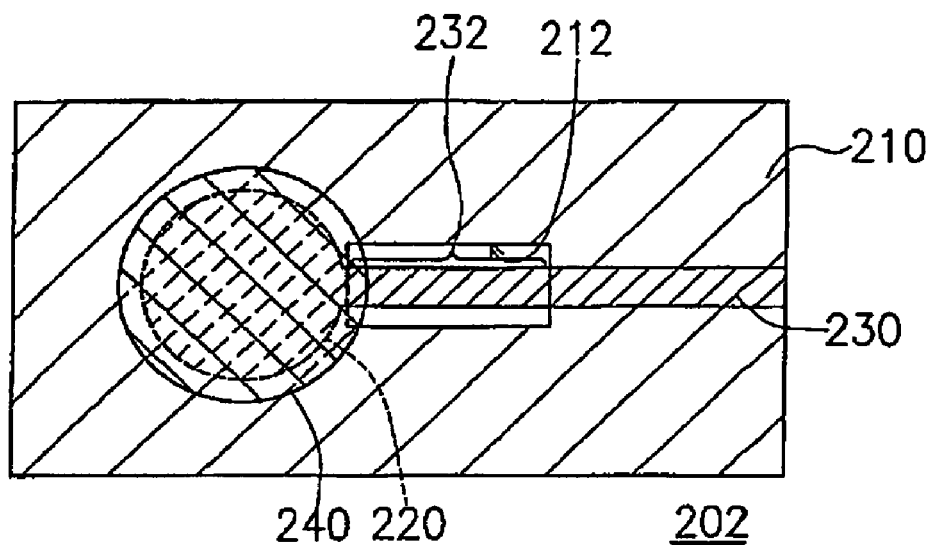
FIG. 3A illustrates a top view of a signal transmission structure in accordance with the second embodiment of the present invention.
Figure 3B:
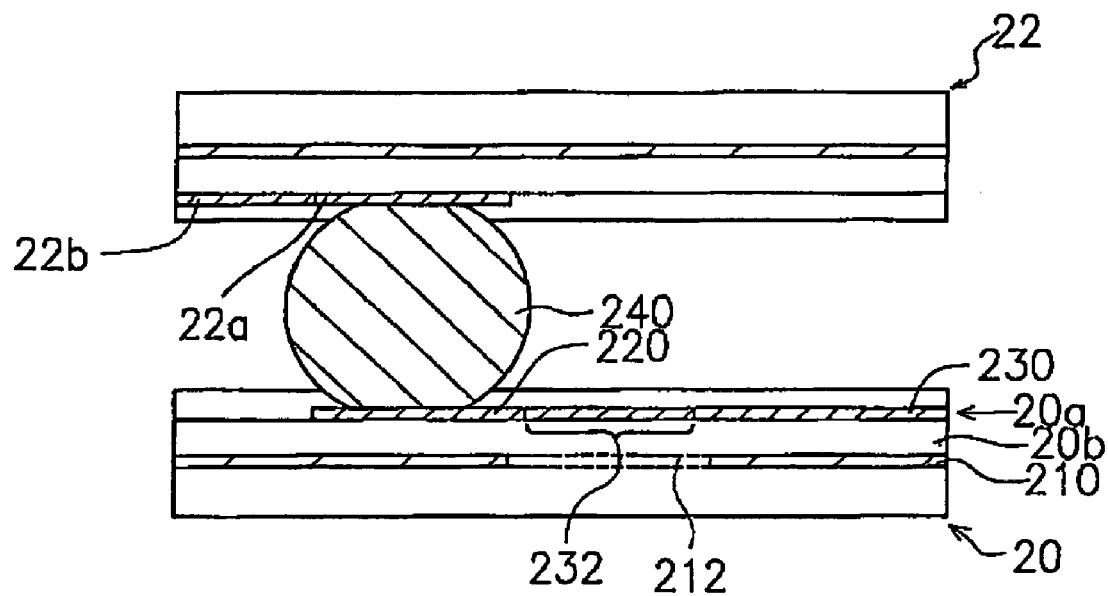
FIG. 3B illustrates a cross sectional view of the signal transmission structure of FIG. 3A, which is applied to a signal transmission media.

Referring to FIGS. 3A and 3B, FIG. 3A illustrates a top view of a signal transmission structure in accordance with the second embodiment of the present invention, and FIG. 3B illustrates a cross sectional view of the signal transmission structure of FIG. 3A, which is applied to a signal transmission media. A signal transmission structure 202 (FIG. 3A) of the second embodiment also includes a reference plane 210, a bonding pad 220, a conductive trace 230 and a conductive ball 240. It is to be noted that the reference plane 210 has a non-reference region 212, which is located so near the conductive ball 240 one of two short sides of the non-reference region 212 is under the conductive ball 240 and tangential to the conductive ball 240 at the right point or the left point thereof, and formed, for example, by an opening within the reference plane 210, and the conductive trace 230 is across the non-reference region 212 just away from the bonding pad 220. Therefore, the equivalent inductance between the neighbor region 232 of the conductive trace 230 and the reference plane 210 can be increased, and the equivalent capacitance between the neighbor region 232 of the conductive trace 230 and the reference plane 210 can be decreased. Accordingly, the high equivalent capacitance between the conductive ball 240 and the reference plane 210 can be compensated, and the conductive ball 240 and the signal route near thereto have better impedance match.

In comparison with the second embodiment mentioned above, the third embodiment also increases the equivalent inductance between the neighbor region of the conductive trace and the reference plane by forming a non-reference region, such as an opening, within the reference plane; however, the location of the non-reference region responds to the location of the conductive ball, and the non-reference region increases the equivalent inductance between the conductive ball and the reference plane, that means reducing the equivalent capacitance between the conductive ball and the reference plane. Therefore, the conductive ball and the signal route near the conductive ball have better impedance match.

Figure 4A:
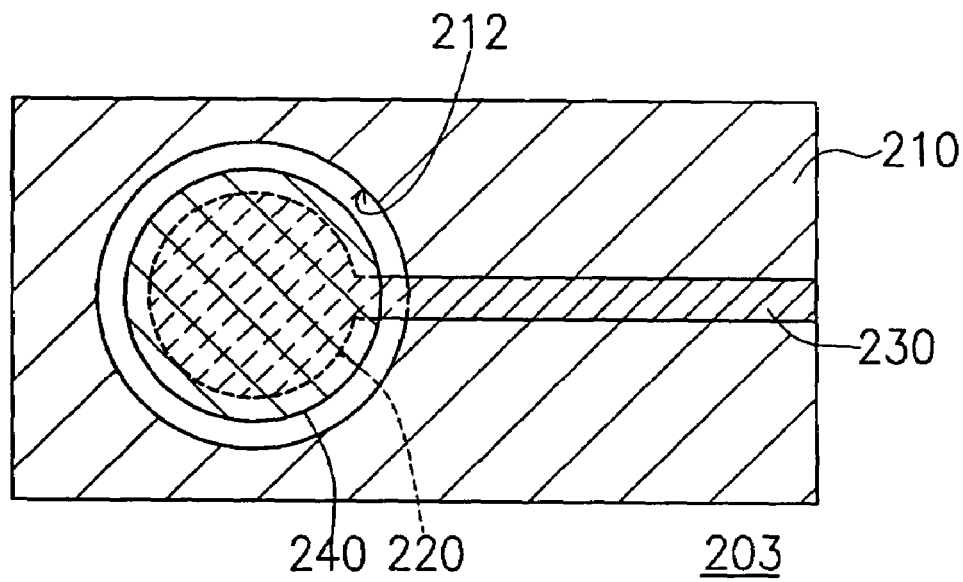
FIG. 4A illustrates a top view of a signal transmission structure in accordance with the third embodiment of the present invention.
Figure 4B:
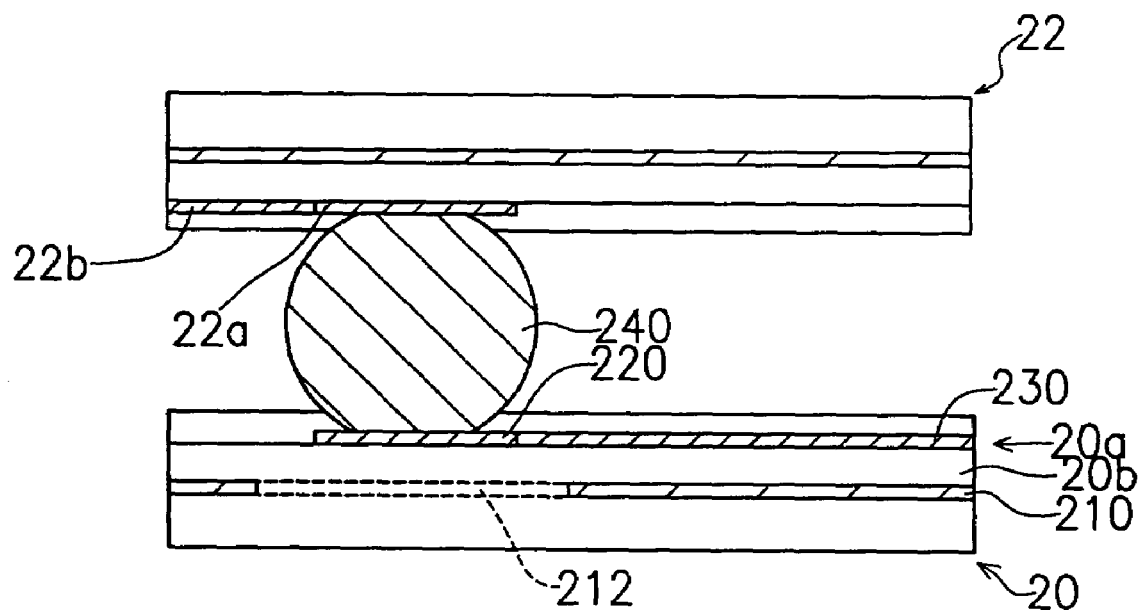
FIG. 4B illustrates a cross sectional view of the signal transmission structure of FIG. 4A, which is applied to a signal transmission media.

Referring to FIGS. 4A and 4B, FIG. 4A illustrates a top view of a signal transmission structure in accordance with the third embodiment of the present invention, and FIG. 4B illustrates a cross sectional view of the signal transmission structure of FIG. 4A, which is applied to a signal transmission media. A signal transmission structure 203 (FIG. 4A) of the third embodiment also includes a reference plane 210, a bonding pad 220, a conductive trace 230 and a conductive ball 240. It is to be noted that the reference plane 210 has a non-reference region 212, which is formed, for example, by an opening within the reference plane 210, and that the non-reference region 212 is under the bonding pad 220. Therefore, the equivalent capacitance between the conductive ball 240 and the reference plane 210 can be decreased, and the equivalent capacitance between the conductive ball 240 and the reference plane 210 can be decreased. Accordingly, the high equivalent capacitance between the conductive ball 240 and the reference plane 210 can be compensated, and the conductive ball 240 and the signal route near the conductive ball have better impedance match.

The fourth embodiment combines the second embodiment and the third embodiment extending the location of the non-reference region of the reference plane responding to the locations of the neighbor region of the conductive trace and the conductive ball, and increasing the equivalent impedance between the conductive ball and the reference plane while reducing the equivalent capacitance between the conductive ball and the reference plane. Therefore, the high equivalent capacitance between the conductive ball and the reference plane can be compensated, and the conductive ball and the signal route near the conductive ball have better impedance match.

Figure 5A:
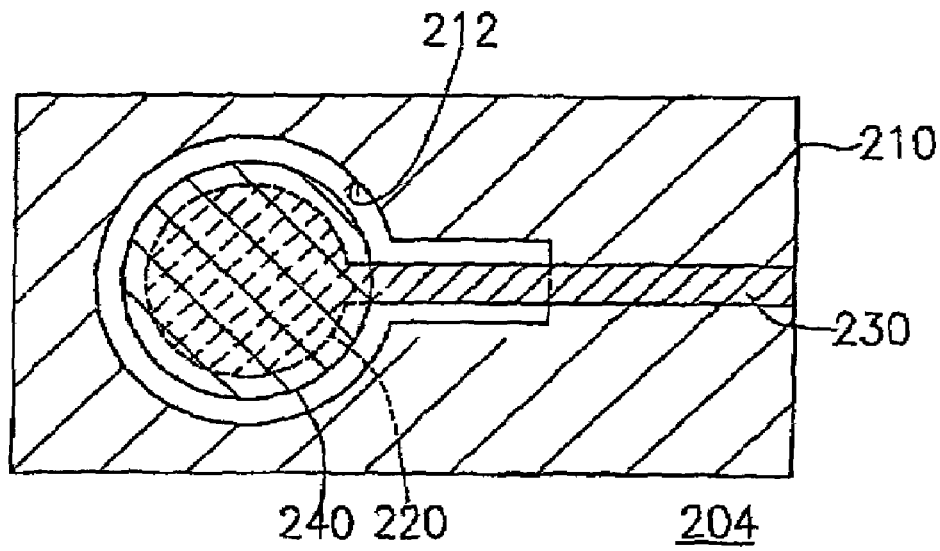
FIG. 5A illustrates a top view of a signal transmission structure in accordance with the fourth embodiment of the present invention.
Figure 5B:
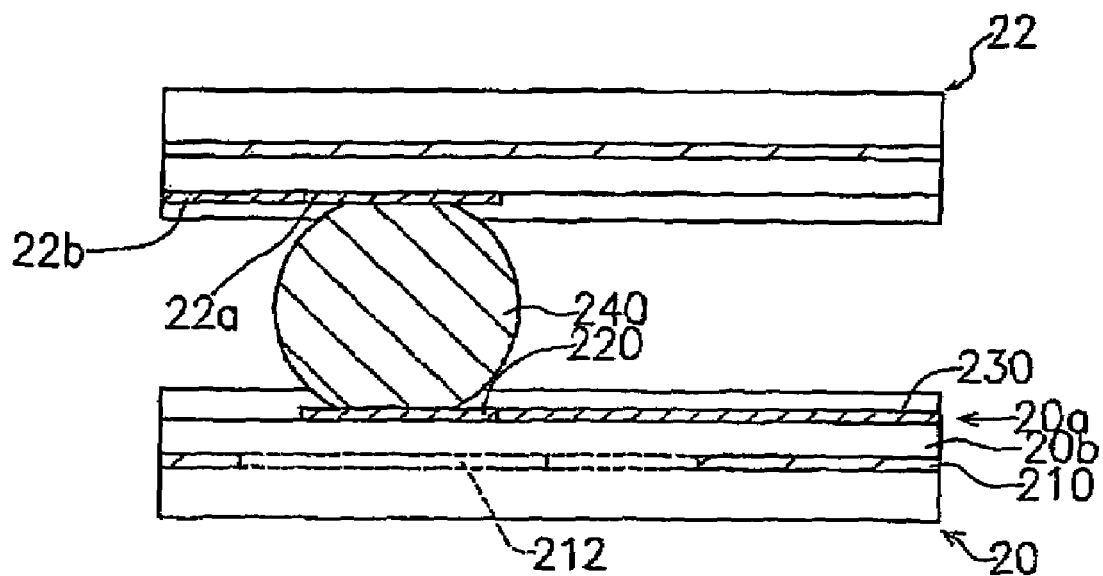
FIG. 5B illustrates a cross sectional view of the signal transmission structure of FIG. 5A, which is applied to a signal transmission media.

Referring to FIGS. 5A and 5B, FIG. 5A illustrates a top view of a signal transmission structure in accordance with the fourth embodiment of the present invention, and FIG. 5B illustrates a cross sectional view of the signal transmission structure of FIG. 5A, which is applied to a signal transmission media. A signal transmission structure 204 (FIG. 5A) of the fourth embodiment also includes a reference plane 210, a bonding pad 220, a conductive trace 230 and a conductive ball 240. It is to be noted that the reference plane 210 has a non-reference region 212, which is formed, for example, by an opening within the reference plane 210, and that one portion of the non-reference region 212 is under the bonding pad 220 and the conductive trace 230 is across another portion of the non-reference region 212 just away from the bonding pad 220. Therefore, the equivalent inductance and capacitance between the conductive ball 240 and the reference plane 210 can be increased and decreased, respectively. Accordingly, the high equivalent capacitance between the conductive ball 240 and the reference plane 210 can be compensated, and the conductive ball 240 and the signal route near the conductive ball have better impedance match.

Figure 6:
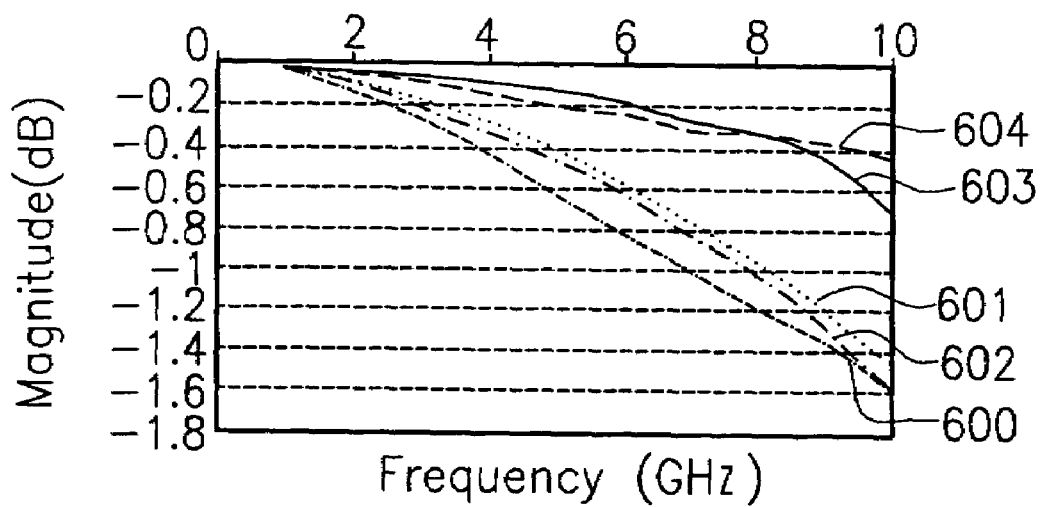
FIG. 6 illustrates frequency responses of the return loss for signal transmission structures.

Referring to FIG. 6, it illustrates frequency responses of the return loss for signal transmission structures. The signal transmission structure 100 of the prior art of FIG. 1A has a frequency response curve 600, the signal transmission structure 201 of the first embodiment of FIG. 2A has a frequency response curve 601, the signal transmission structure 202 of the second embodiment of FIG. 3A has a frequency response curve 602, the signal transmission structure 203 of the third embodiment of FIG. 4A has a frequency response curve 603 and the signal transmission structure 204 of the fourth embodiment of FIG. 5A has a frequency response curve 604. Therefore, under the same frequency the four embodiments of the present invention have higher return losses than that of the signal transmission structure of the prior art.

Figure 7:
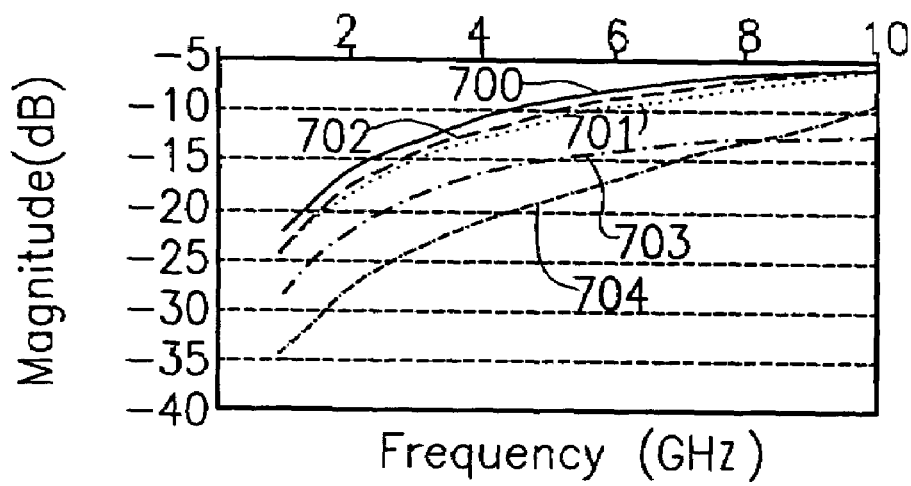
FIG. 7 illustrates frequency responses of the insertion loss for signal transmission structures.

Referring to FIG. 7, it illustrates frequency responses of the insertion loss for signal transmission structures. The signal transmission structure 100 of the prior art of FIG. 1A has a frequency response curve 700, the signal transmission structure 201 of the first embodiment of FIG. 2A has a frequency response curve 701, the signal transmission structure 202 of the second embodiment of FIG. 3A has a frequency response curve 702, the signal transmission structure 203 of the third embodiment of FIG. 4A has a frequency response curve 703 and the signal transmission structure 204 of the fourth embodiment of FIG. 5A has a frequency response curve 704. Therefore, under the same frequency the four embodiments of the present invention have lower insertion losses than that of the signal transmission structure of the prior art.

Figure 8:
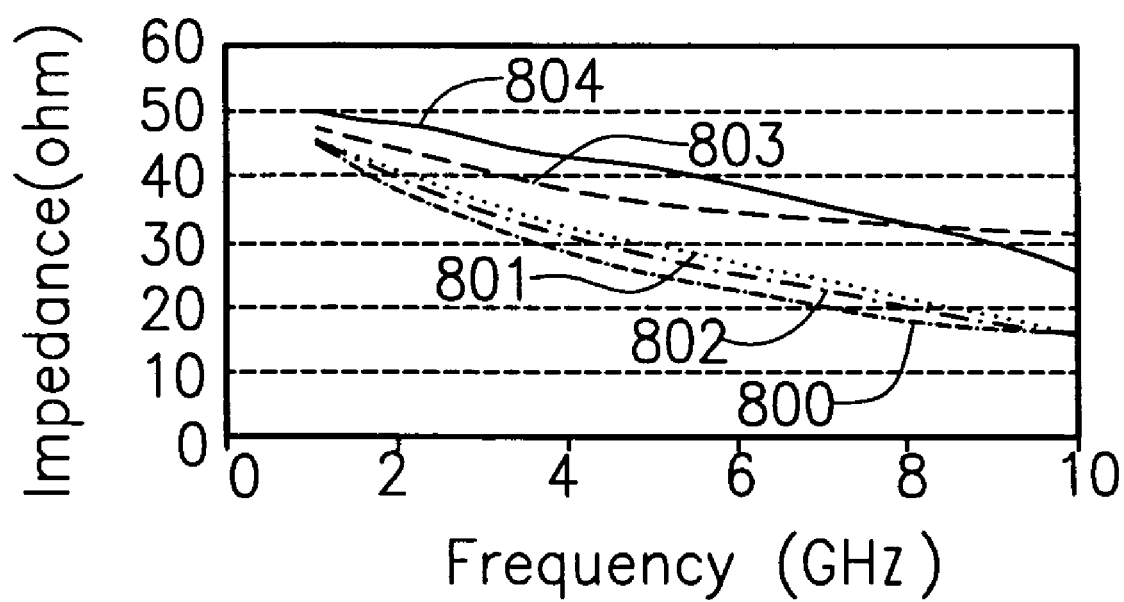
FIG. 8 illustrates a frequency-impedance coordinate system of an equivalent impedance for the conductive ball of the signal transmission structure.

Referring to FIG. 8, it illustrates a frequency-impedance coordinate system of an equivalent impedance for the conductive ball of the signal transmission structure. The signal transmission structure 100 of the prior art of FIG. 1A has an impedance curve 800, the signal transmission structure 201 of the first embodiment of FIG. 2A has an impedance curve 801, the signal transmission structure 202 of the second embodiment of FIG. 3A has an impedance curve 802, the signal transmission structure 203 of the third embodiment of FIG. 4A has an impedance curve 803 and the signal transmission structure 204 of the fourth embodiment of FIG. 5A has an impedance curve 804. Therefore, under the same frequency the four embodiments of the present invention have higher equivalent impedances than that of the signal transmission structure of the prior art.

From the above descriptions, the signal transmission structures in accordance with the present invention reduces an equivalent capacitance at the conductive ball and the signal route near the conductive ball or increases an equivalent inductance at the conductive ball and the signal route near the conductive ball, for compensating a high equivalent capacitance between the conductive ball and the reference plane. Therefore, the conductive ball and the signal route near the conductive ball have better impedance match, and integrity of signals can be maintained after these signals pass through the conductive ball and the signal route near the conductive ball. Therefore, the signal transmission structure in accordance with the present invention can efficiently increase electrical performance of the signal transmission media, such as an IC carrier or a printed circuit board.

Although the present invention has been described in terms of an exemplary embodiment, it is not limited thereto. Rather, the appended claims should be constructed broadly to include other variants and embodiments of the invention which may be made by those skilled in the field of this art without departing from the scope and range of equivalents of the invention.

What is claimed is:

1. A signal transmission structure, comprising:
   a reference plane;
   a bonding pad, which is non-coplanar with the reference plane;
   a conductive trace non-coplanar with the reference plane, one end of the conductive trace connected to the bonding pad, the conductive trace having a neighbor region with a width smaller than a width of the remainder of the conductive trace; and
   a conductive ball located on a side of the bonding pad, which is apart from the reference plane, wherein an increment of an equivalent inductance between the neighbor region of the conductive trace and the reference plane, can compensate an equivalent capacitance between the conductive ball and the reference plane by providing the neighbor region of the conductive trace with a reduced width.

2. The signal transmission structure of claim 1, wherein the reference plane is a ground plane or a power plane.

3. The signal transmission structure of claim 1, wherein the signal transmission structure is disposed on a printed circuit board.

4. The signal transmission structure of claim 1, wherein the conductive trace is adapted for signal transmission.

5. A signal transmission structure, comprising:
   a reference plane having a non-reference region;
   a bonding pad which is non-coplanar with the reference plane;
   a conductive trace coplanar with the bonding pad, one end of the conductive trace connected to the bonding pad, wherein the conductive trace crosses the non-reference region just away from the bonding pad; and
   a conductive ball located on a side of the bonding pad, which is away from the reference plane, wherein the non-reference region is so near the conductive ball that one of two short sides of the non-reference region is under the conductive ball and tangential to the conductive ball at the right point or the left point thereof.

6. The signal transmission structure of claim 5, wherein the reference plane is a ground plane or a power plane.

7. The signal transmission structure of claim 5, wherein the signal transmission structure is disposed on a printed circuit board.

8. The signal transmission structure of claim 5, wherein the conductive trace is adapted for signal transmission.

9. A signal transmission structure, comprising:
   a reference plane having a first non-reference region;
   a bonding pad which is non-coplanar with the reference plane;
   a conductive trace coplanar with the bonding pad, one end of the conductive trace connected to the bonding pad; and
   a conductive ball located on a side of the bonding pad, which is away from the reference plane, wherein the first non-reference region is under the bonding pad.

10. The signal transmission structure of claim 9, wherein the reference plane further comprises a second non-reference region just away from the bonding pad.

11. The signal transmission structure of claim 9, wherein the reference plane is a ground plane or a power plane.

12. The signal transmission structure of claim 9, wherein the signal transmission structure is disposed on a printed circuit board.

13. The signal transmission structure of claim 9, wherein the conductive trace is adapted for signal transmission.

* * * * *